United States Patent [19]

Heinen et al.

[11] Patent Number: 4,674,095
[45] Date of Patent: Jun. 16, 1987

[54] LASER DIODE ARRAY

[75] Inventors: Jochen Heinen, Haar; Franz Kappeler, Puchheim; Heinz Westermeier, Neubiberg, all of Fed. Rep. of Germany

[73] Assignee: Siemens Aktiengesellschaft, Berlin and Munich, Fed. Rep. of Germany

[21] Appl. No.: 712,138

[22] Filed: Mar. 15, 1985

[30] Foreign Application Priority Data

Mar. 27, 1984 [DE] Fed. Rep. of Germany ....... 3411314

[51] Int. Cl.⁴ .............................................. H01S 3/19
[52] U.S. Cl. ...................................... 372/50; 372/46
[58] Field of Search ............................ 372/50, 46, 97

[56] References Cited

FOREIGN PATENT DOCUMENTS 1156506 10/1963 Fed. Rep. of Germany.
1439316 7/1975 Fed. Rep. of Germany.
0112789 9/1981 Japan ..................................... 372/50
1091246 11/1967 United Kingdom.

Primary Examiner—James W. Davie
Attorney, Agent, or Firm—Hill, Van Santen, Steadman & Simpson

[57] ABSTRACT

A laser diode array has laser diode strips divided into groups which are separated from one another by zones having a damping or attenuation effect for radiation generated in the diodes. A maximum number of laser diode strips provided within each group is determined such that super radiation or oscillatory mode radiation generated within the groups and which deviates from a primary radiating direction of strips within the groups is negligible.

17 Claims, 1 Drawing Figure

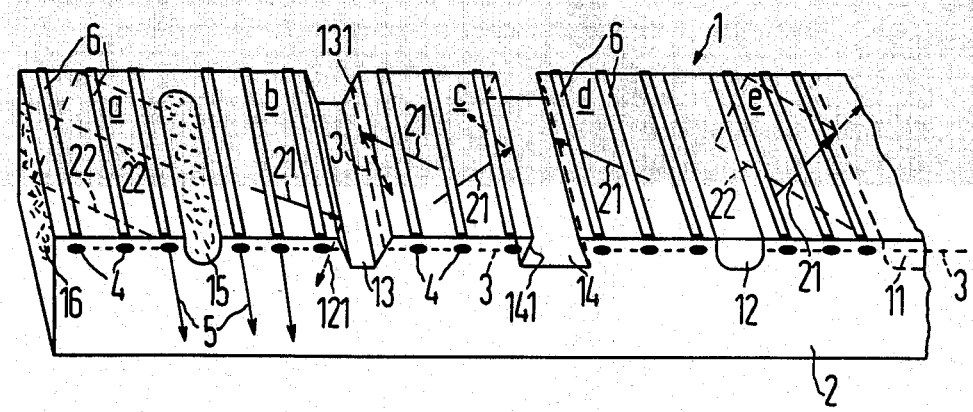

LASER DIODE ARRAY

BACKGROUND OF THE INVENTION

The present invention relates to a laser diode array having a plurality of individual laser diode strips disposed substantially in one plane in a semiconductor body and substantially parallel to one another. The strips have a respective optical resonator associated therewith such that a prescribed emission direction of an intended laser radiation emission parallel to a direction of the laser diode strips occurs.

It is known to provide a plurality of strip-shaped laser diodes arranged in side-by-side fashion in a semiconductor body. A respective position of the individual laser diode strips in the semiconductor body is definable by a variety of techniques. For example, they may be defined by parallel oxide strips (oxide strip laser), by parallel waveguide strips, by parallel high-resistant strip zones, and the like. Such high-resistant strip zones are disclosed relative to a semiconductor diode body containing a plurality of laser diode strips in German Letters Pat. No. 14 39 316, incorporated herein by reference, whereby a division into laser diode strips was proposed therein for improved cooling.

In addition to strip diode lasers, laser diodes having a planar pn-junction in a semiconductor body are also known.

It is known from German AS No. 11 56 506, incorporated herein by reference, that optical coupling can occur between neighboring laser-active regions in a semiconductor body with the result that a correlation between the laser radiations generated in two such laser-active zones occurs. This is based on an overlap of portions of the respective active regions of the corresponding laser-active zones, and even across regions of the semiconductor body in which the conditions for the appearance of stimulated emission or the presence of a reoccupation is not established, for example because the threshold current for the stimulated emission is not reached there.

SUMMARY OF THE INVENTION

It is an object of the present invention to achieve a high radiation power for a laser diode array and/or an improvement of the laser radiation yield in view of the electric current to be expended, i.e. to achieve a higher radiation yield per unit of electrical power expended. This object is achieved for a laser diode array by dividing the plurality of laser diode strips into groups, neighboring groups being separated by zones substantially parallel to the diode strips. The zones have a damping property for super radiation or oscillatory mode radiation generated within the respective groups. The maximum number of strips within each group is chosen such that negligible super radiation or oscillatory mode radiation deviating from the laser radiation emission direction occurs within the group.

The teaching of the invention is based on the perception that, given a laser diode array comprising a plurality of individual laser diode strips positioned next to one another in parallel, super radiation and/or laser radiation increasing to a very considerable degree and having undesired oscillatory modes, can occur in directions deviating from the emission direction of the desired laser radiation. The preferred emission direction is parallel to the laser diode strips. It has been determined that such undesired radiation already occurs given an array having only a few, for example 12, 20, or 30 laser diode strips parallel to one another. Such an effect, however, greatly increases disproportionately given an array comprising even more laser diode strips. It has been determined from experiments that considerable deviations from proportional behavior have occurred with increasing current density with which a respective laser diode array has been supplied. This is dependent on the respective number of laser diode strips that were provided in a corresponding investigated laser diode array. The results, which initially appeared incoherent, led to the further perception that disproportionally increasing super radiation and/or radiation of undesired oscillatory modes leads to a limitation of the maximum obtainable radiation power and/or to a very poor ratio of desired (useful) radiation power to pump current power.

For a laser array in accordance with the invention, the plurality of laser diode strips are divided into groups. Each and every group is composed of a number of laser diode strips that are proximate to one another. The respective plurality of laser diode strips in a corresponding group is limited to a number such that super radiation occurs across the region of the corresponding group only to limited degree; and radiation having oscillatory modes deviating from the desired emission direction can only form to a low degree so that undesired radiations are still relatively very low-intensity in comparison to the intentionally emitted laser radiation. They thus consume only a small part of the pump current power which is acceptable for the operation of a laser diode array. A specific maximum numerical value cannot be specified for the number of laser diodes of a respective group within the framework of the invention since such a corresponding maximum numerical value is also dependent on other boundary conditions. The value is dependent on the specific gain, on the level of quality of the optical resonator, on the length and width of the laser diode strips, the spacings of the strips from one another, the width/spacing ratio, and on optical coupling of the strips. Such a maximum number according to the invention can, however, be identified by practical testing. Specifically, a determination is made with respect to the number of laser diode strips of a group after which the above-described dis-proportionate increase (smaller rate of increase) of the desired laser radiation power occurs given a further increase of the electrical pump current power.

Since an array cannot be limited to such a desired number of laser strips, it is further provided in the invention that strip-shaped zones extending essentially parallel to the laser diode strips are to be spatially provided between neighboring groups (composed of a determined respective number of laser diode strips). These strip-shaped zones separate two groups disposed respectively proximate in the semiconductor body from one another, and partition neighboring groups off from one another. In order to have this separation or partitioning take effect, zones (between neighboring groups) which have a damping or attenuation property for the laser radiation and for the super radiation of the corresponding laser diode array are generated. Since these zones extend parallel to the laser diode strips, their damping property at least does not have a noticeably disadvantageous effect on generating laser radiation in the prescribed emission direction. However, both super radiation as well as laser radiation deriving therefrom which has a direction (in the semiconductor or, respectively, in the laser diode array) deviating from the prescribed emission direction are indeed greatly attenuated as soon as they proceed into the zone provided in accordance with the invention.

In particular, those laser oscillatory modes whose radiation in the semiconductor material of the array has a circulating radiation path can be attenuated or prevented with the zones provided in accordance with the invention. Consequently, directional changes required for the circulation are based on total reflections of the radiation at the boundary surface semiconductor material to air. Such total reflection as is known is loss-free, and a corresponding oscillatory mode (circulation) has a minimum value of threshold current density.

Let it be pointed out with respect to the zones of the invention that these in fact have a high damping effect for super radiation and undesired oscillatory modes. However, they do not preclude the optical coupling that is necessary for a laser diode array having laser diode strips optically coupled to one another. For this purpose, it can also be provided that the zones of the invention extending in the direction of the laser diode strips proximate to the respective outermost laser diode strip of a group extend only over a portion of the length of the laser strip, so as to achieve the object of this invention. Accordingly, laser diode strips adjacent to one another and which each belong to a different group are not partitioned off from one another by the zone of the invention over the remaining portion of their length.

In the normal case, laser diode arrays are laser diode strips disposed side-by-side next to one another in a surface and normally in one plane of the corresponding semiconductor body. The disposition in one plane of such a surface is particularly preferred for execution of epitaxy processes for the manufacture of such an array.

The damping property achieved by the zones which partition the groups off from one another has been mentioned above. Such a damping property can be realized in various fashions within the framework of the invention. Such a damping property can, for example, be an optical scattering effect for such undesired radiation in the array. A corresponding damping effect can also be composed of beam deflection for such undesired radiation, namely deflection in a direction which conducts the radiation out of the surface or plane of the arrangement of the laser diode strips. Outside of this plane, even occurring super radiation cannot further intensify. Another technique for realizing such a damping effect is to provide a zone with unpumped semiconductor material, i.e. to provide such a strip between neighboring groups in the semiconductor body in which there is no pump current density effective for beam intensification and, instead, generated radiation is absorbed and converted into non-radiating leakage. Thus, efficiency is increased, particularly by employing in such zones according to the invention radiation-absorbing centers which have been added by means of proton implantation (in addition to the lack of a pump current), i.e. in which there is increased absorbability for super or laser radiation entering into such a zone.

BRIEF DESCRIPTION OF THE DRAWING

The drawing illustrates, in a perspective view, groups of laser diode strips in a semiconductor body wherein damping zones are provided between groups in accordance with the invention.

DESCRIPTION OF THE PREFERRED EMBODIMENTS

In the drawing FIGURE, a semiconductor body 2 is provided in which a plurality of laser diode strips 4 are present at one surface, and preferably in one plane 3 of the body. In the FIGURE, the end face of these laser diode strips 4 is visible, i.e. the emission face of the semiconductor body 2 for the generated laser radiation 5. In the semiconductor body 2, a respective laser diode strip 4 in the surface or plane 3 runs under and along a respective electrode strip 6 via which the required pump current is supplied. The visible end face and the other end face of the laser diode strip 4 situated at the other end of the individual laser diode strip (this other end face not being visible in the FIGURE) have a reflectivity for the laser radiation generated in the laser diode strip 4 so as to cause a reciprocating of the radiation therein. Thus, a corresponding optical resonator is formed from which a laser component 5 is emitted.

According to one feature of the invention, the laser diode strips of the overall array 1 are divided into groups a, b, c, d, e, . . . . For the sake of clarity in the FIGURE, only a very small number of laser diode strips 4 has been respectively shown for each group a, b, . . . . In practice, up to a maximum of about 10 to 40 laser diode strips in a group are useful. According to the invention, the number of groups in an array 1 of the invention can be selected in an arbitrarily high manner.

The FIGURE shows variations for embodiments of zones 11 through 16 to be employed for the invention. Embodiments of the invention can contain both a single alternative as well as a plurality of alternatives, for example, in mixed fashion. One such alternative is, for example, a barrier strip 11 of the material of the semiconductor body which has a partitioning effect. Reference numeral 12 indicates an alternative wherein such a barrier strip comprises a proton implantation at least to such a depth of the semiconductor body in which the surface 3 of the laser diode strips 4 or the radiation propagation surface lies. Two embodiments 13 and 14 show a further alternative, namely wherein reflection or deflection of undesirably occurring super radiation and/or radiation having undesired oscillatory modes occurs out of the surface of radiation propagation. Reference numeral 15 shows the alternative of the invention wherein a channel-like depression is formed in the semiconductor body and wherein an inside surface of the channel has a roughening so as to cause scatter for the radiation. This roughening is provided at least in the region of the radiation propagation surface. To be included with the alternative 15 is the alternative 16 wherein the outside of the semiconductor body 2 comprises a roughening which causes scatter for an end-position group of laser diode strips at least in a region of the radiation propagation surface.

Indicated with reference numeral 21 in the region of the group e is super radiation which can necessarily occur in such a region in the surface 3 of the laser diode strips 4 and then proceeds in this surface which is then also the radiation propagation surface for such super radiation 21 as well. When such super radiation 21 impinges the zone 11, radiation 21 penetrating further into this zone 11 experiences no further intensification, but rather experiences absorption. There is also practically no reflectivity for such radiation 21 at the transition into the zone 11. This reflectivity might give rise to back-reflection of the super radiation 21 and could even give rise to the formation of circulating oscillatory modes. Such a circulation which would otherwise be possible is indicated incompletely with reference numeral 22 and in broken lines. Preferably, no electrode is located on the surface of the semiconductor body in the region of the zone or barrier strip 11, since current feed is not to be provided there. When, however, a surface-wide electrode metallization of the corresponding surface of the semiconductor body 2 has, for example, been provided for any reason whatsoever, then such a zone 11 can be realized since an electrically insulating region is provided under such a surface-wide metallization in the near-surface region of the zone 11 (i.e. between the surface of the semiconductor body 2 and the inward surface 3 of the laser diode strip 4). Such an electrically insulating layer can, for example, be realized by a correspondingly deep proton implantation.

A particularly preferable alternative is to provide a proton-implanted zone or barrier strip 12. Such a proton implantation is present here at the depth of the surface 3, i.e. the radiation propagation surface corresponding to the surface 3 is covered with the proton implantation. Super radiation 21 entering into this zone 12 experiences particularly high absorption due to the radiation-absorbing imperfections.

The zones 13 and 14 are trough-shaped or channel-shaped incisions of the semiconductor body 2 either having a side wall 131 inclined at an angle so that the side wall faces downwardly, or a side wall 141 inclined in dovetail fashion so that the wall faces upwardly, with respect to impinging super radiation. Super radiation referenced 21 which impinges such an inclined surface 131 or 141 is either reflected downward into the semiconductor body 2 (surface 131 as shown at 121) or is reflected upwardly and out of this semiconductor body 2 (surface 141) at a corresponding angle.

The roughening of the surface of the channel-like depression 15 of the semiconductor body 2 scatters super radiation and, in particular, prevents the occurrence of undesired oscillatory modes 22 since the back-reflection into the region of the group a which is necessary per se for this is eliminated. The same applies to the roughening 16.

As already mentioned above, all zones are designed extending into the semiconductor body 2 with such depth that the separation into the individual groups a, b, ... necessary for the principle of the invention results. However, it is also possible to design an embodiment of the invention such that such a zone does not extend over the entire length of the laser diode strips 4 but, as indicated with respect, for example to the channel 15, the channel extends only over a substantial or major part of the length of the neighboring laser diode strips 4. A remaining, residual region can serve the purpose of maintaining a certain optical coupling (even) between neighboring groups (groups a and b here).

Laser diode strips 4 provided in the invention have a width of, for example 2 through 4 $\mu$m. They are disposed within a respective group, for example at spacings of 10 to 20 $\mu$m. The length of a laser diode strip amounts, for example from 200 to 400 $\mu$m. Given moderate values of the specific gain and of the quality of the optical resonator, a respective group can encompass about 20 to 40 laser diode strips 4 without the disadvantages to be avoided with the invention which otherwise occur for a larger plurality of laser diode strips of an array already occurring, namely too low a limit for maximum radiation power and/or an unfavorably high electrical power usage for radiation power to be obtained.

The invention is to be employed both for optically coupled laser diode strips as well as for arrays without such optical coupling.

Although various minor changes and modifications might be proposed by those skilled in the art, it will be understood that we wish to include within the claims of the patent warranted hereon all such changes and modifications as reasonably come within our contribution to the art.

We claim as our invention:

1. A laser diode array, comprising:
    a plurality of individual laser diode strips disposed substantially in one plane in a semiconductor body, being spaced from one another, and being substantially parallel to one another;
    the strips haing a respective optical resonator associated therewith such that a prescribed emission direction of an intended laser radiation emission parallel to a direction of the laser diode strips occurs;
    the strips being divided into groups separated by attenuating zone means and with each group having a plurality of said strips, said attenuating zone means attenuating super radiation or oscillatory mode radiation generated within and radiated from the groups and having directions deviating from the prescribed emission direction; and
    each group having as a maximum a number of laser diode strips chosen such that the super radiation or oscillatory mode radiation which is present and associated with the group is substantially negligible.

2. An array according to claim 1 wherein an attenuating zone means is provided between one of the groups and an end of the semiconductor body lateral to a longitudinal extent of the strips.

3. An array according to claim 1 wherein the attenuating zone means comprises a zone extending along an entire length of the laser diode strips of the group, said zone being laterally adjacent the group and parallel to the strips of the group.

4. An array according to claim 1 wherein the attenuating zone means extends along a substantial portion of a length of the laser diode strips of the group to which the attenuating zone means is adjacent.

5. An array according to claim 4 when the attenuating zone means extends along the majority of a length of the laser diode strips of the group to which the attenuating zone means is adjacent.

6. An array according to claim 1 wherein at least one of the attenuating zone means comprises a trough-like depression having side walls roughened sufficient to cause scattering of super radiation or oscillatory mode radiation present.

7. An array according to claim 1 wherein at least one end face of the semiconductor body laterally adjacent a group of laser strips is roughened sufficiently to cause scattering of super radiation or oscillatory mode radiation.

8. An array according to claim 1 wherein at least one of the attenuating zone means comprises a trough-like depression with lateral side walls which are inclined relative to a plane containing the laser diode strips of an associated group, and the inclined lateral walls being designed so as to provide a deflection of the undesired radiation striking it in a direction away from said plane.

9. An array according to claim 8 wherein said direction is upwardly.

10. An array according to claim 8 wherein the direction of reflection is downwardly.

11. An array according to claim 1 wherein at least one of the attenuating zone means provides a low electrical current density therein in comparison to a current density in said laser diode strips adjacent thereto and associated therewith.

12. An array according to claim 1 wherein at least one of said attenuating zone means comprises a semiconductor material which has been proton implanted.

13. An array according to claim 1 wherein at least one of said attenuating zone means comprises an implanted zone.

14. An array according to claim 1 wherein each group has a maximum number of 40 strips.

15. An array according to claim 14 wherein each group has a maximum number of 10 strips.

16. A laser diode array, comprising:
a semiconductor body having first and second end faces opposite one another and first and second lateral faces;
a plurality of laser diode strips with associated optical resonators extending between the first and second faces, parallel to one another, and near a major face of the semiconductor body, said laser diode strips generating a laser radiation in a primary direction parallel to the laser diode strips;
at said major face a plurality of electrode strips associated with the laser diode strips;
the laser diode strips being divided into groups with each group having from 10 to 40 of said strips and being separated from an adjacent group by zone means, said zone means comprising elongated zones running parallel to the laser diode strips and extending from at least one of the first and second end faces along a majority of a length of an adjacent laser diode strip; and
said zone means reducing power consumed by undesirable laser radiation in directions away from said primary direction and which does not contribute to the primary direction radiation.

17. An array according to claim 16 wherein each of the groups has a maximum number of strips chosen such that the undesired radiation consumes a negligible amount of power compared to pumping power for the laser diode strips of the group.

* * * * *